United States Patent [19]

Clorfeine

[11] 3,909,740

[45] Sept. 30, 1975

[54] LUMPED ELEMENT, BROAD-BAND MICROWAVE APPARATUS USING SEMICONDUCTOR DIODES OPERATING IN THE TRAPATT MODE

[75] Inventor: Alvin Seymour Clorfeine, Cranbury, N.J.

[73] Assignee: RCA Corporation, New York, N.Y.

[22] Filed: Feb. 19, 1974

[21] Appl. No.: 443,410

[52] U.S. Cl. .................. 330/34; 330/53; 307/317 R; 330/61 A

[51] Int. Cl.² .......................................... H03F 3/10

[58] Field of Search ...................... 330/53, 61 A, 34; 331/107 R; 332/52; 307/317 R, 324, 323, 318, 285

[56] References Cited

UNITED STATES PATENTS

| | | | |
|---|---|---|---|
| 3,743,967 | 7/1973 | Fitzsimmons et al. | 330/53 X |
| 3,836,872 | 9/1974 | Yu et al. | 331/107 R |

OTHER PUBLICATIONS

IEEE Transactions on Microwave Theory & Techniques, Vol. MTT-18, No. 11, Nov., 1970, "Basic Principles & Properties of Avalanche Transit-Time Devices," pp. 752–772.

Electronic Letters — Vol. 6 — No. 23, Nov. 12, 1970, pp. 744–746, (FIG. 2), "Efficient Power Extraction at Trapatt Harmonics."

*Primary Examiner*—Nathan Kaufman
*Attorney, Agent, or Firm*—Edward J. Norton; Joseph D. Lazar; Michael A. Lechter

[57] ABSTRACT

A semiconductor diode operated in the TRAPATT mode generates or amplifies a microwave signal at a plurality of harmonically related frequencies. Harmonic energy extraction networks include variable lumped capacitance elements for tuning. The harmonic energy extraction networks are used to extract energy at a single desired output frequency from the microwave signal. The selected output frequency is then transmitted to a terminating load impedance.

6 Claims, 3 Drawing Figures

LUMPED ELEMENT, BROAD-BAND MICROWAVE APPARATUS USING SEMICONDUCTOR DIODES OPERATING IN THE TRAPATT MODE

BACKGROUND OF THE INVENTION

The invention herein disclosed was made in the course of or under a contract or subcontract thereunder with the Department of the Navy.

The present invention relates to a microwave amplifier and more particularly to a broad band microwave amplifier using a semiconductor diode, operating in the TRAPATT mode, and variable lumped circuit elements. The present invention permits extraction of power at the fundamental or at a desired harmonic of the fundamental.

The wave form of the signal generated or amplified by a semiconductor diode operating in the TRAPATT mode is rich in harmonic content. It is generally recognized that a successful TRAPATT amplifier design must provide proper impedances for the fundamental trapped plasma frequency and at least the second and third harmonics thereof. In traditional TRAPATT amplifier design, power is extracted from the fundamental frequency since, in principle, highest efficiencies may be obtained in this manner. The traditional TRAPATT amplifier design poses problems at the higher microwave frequencies. For example, a TRAPATT amplifier designed to amplify a 3 GHz signal would require a diode with a relatively thin high resistivity region with correspondingly small design tolerances. In addition, the design must provide for the proper impedances at 3 GHz, 6 GHz and 9 GHz. The relatively short wavelengths associated with these high frequencies pose significant problems in conventional circuit design.

Another significant problem associated with the traditional TRAPATT amplifier design concerns the method by which the circuits are conventionally tuned in order to provide proper impedances for the fundamental trapped plasma frequency and the second and third harmonics thereof. Traditionally, an amplifier of this design is tuned by placing metal tuning stubs across one or more exposed metal transmission lines which carry the TRAPATT signal. This method normally requires the use of a number of metal tuning stubs in conjunction with one or more transmission lines. The planar orientation of these stubs is such that the longitudinal axis of each stub is initially located substantially perpendicular to the longitudinal axis of the transmission line upon which the stub is placed.

The impedance presented by each transmission line varies as a function of: the location of each stub along the longitudinal axis of the transmission line, the planar orientation of the stub with respect to this longitudinal axis and the physical dimensions of the stub itself. With an appropriate measuring device connected to the output of the amplifier, the metal tuning stubs are moved back and forth along the longitudinal axis of the transmission line until the output peaks. Tuning in the traditional manner is further complicated by the fact that moving a stub to tune at one frequency affects the tuning at the harmonically related frequencies as well. This tuning interference necessitates continued readjustment of the stubs until the approximate peak output is obtained.

When the output peaks, further tuning ceases and the location of each tuning stub with relation to its transmission line is noted. Using the locations thus obtained, a first approximation circuit is then fabricated. Due to the large number of variables involved, including the longitudinal location, planar orientation and physical dimensions of each tuning stub, the first approximation circuit generally requires further tuning. This further tuning is normally accomplished by either using additional metal tuning stubs, electrically conductive paint, or a combination of the two methods. This cut and try method of tuning and fabrication poses a serious impediment to the manufacture of these devices in any significant quantities.

SUMMARY OF THE INVENTION

A broad-band microwave apparatus which includes a semiconductor element, a harmonic energy extraction means and an output means. The semiconductor element is capable of generating a microwave signal at a plurality of harmonically related frequencies. The harmonic energy extraction means comprises variable lumped element electrical circuits. These circuits enable the extraction of energy at any one of a broad band of harmonically related frequencies. The output means transmits the extracted energy at the selected harmonic frequency to a terminating load impedance.

DETAILED DESCRIPTION OF THE INVENTION

Figure 1:
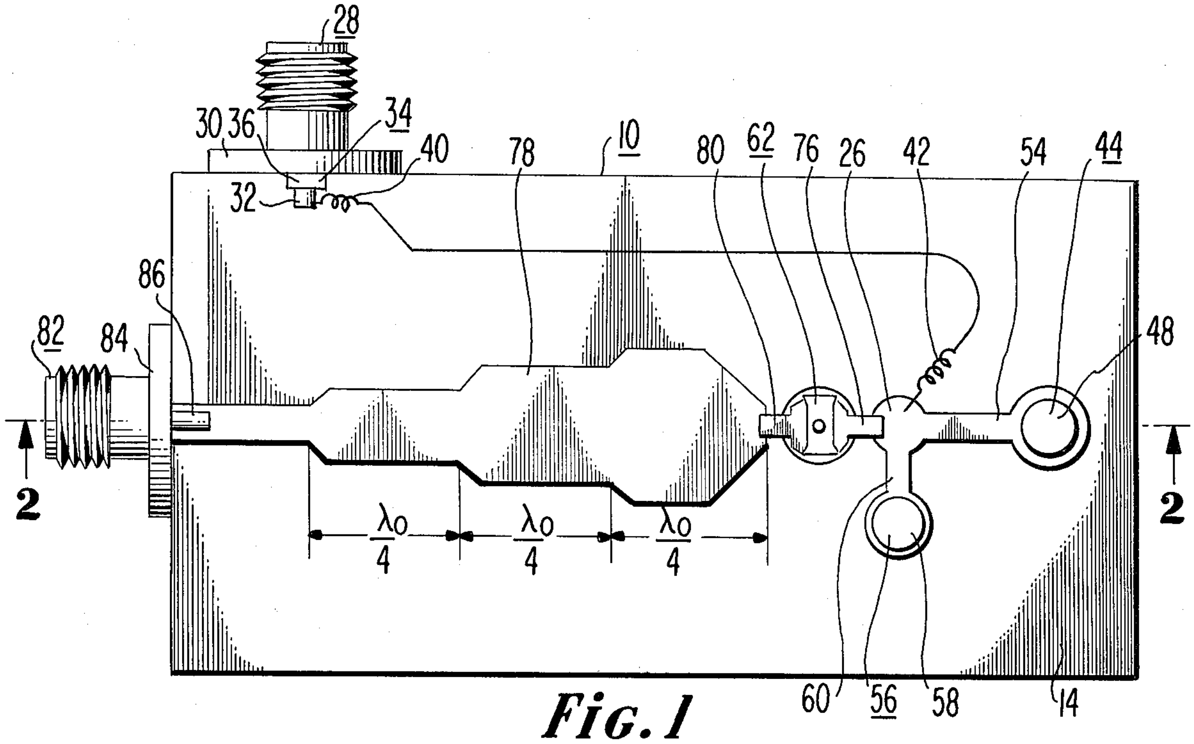
FIG. 1 is a top plan view of a form of the broad-band microwave apparatus of the present invention.
Figure 2:
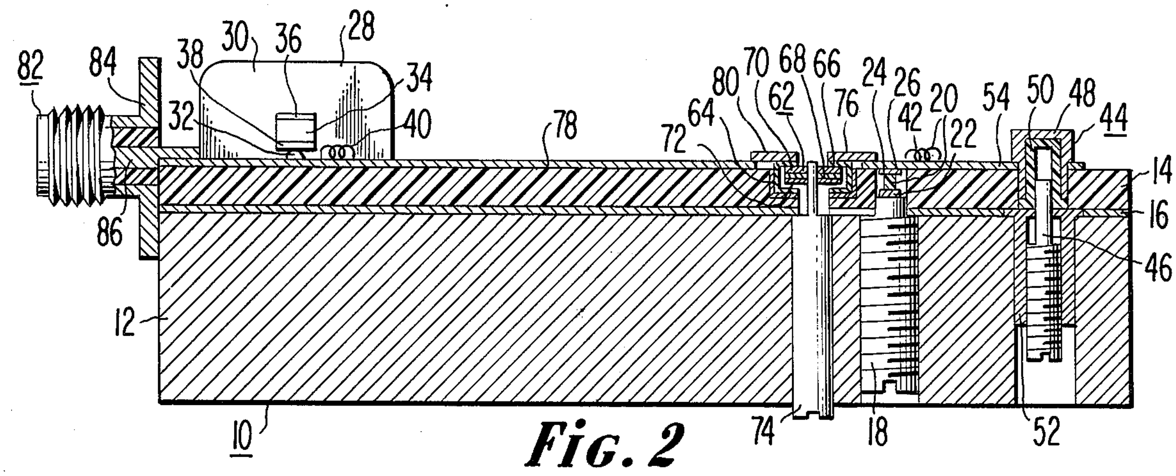
FIG. 2 is a sectional view taken along line 2—2 of FIG. 1.

Referring to FIGS. 1 and 2 of the drawing, there is shown a broad-band microwave apparatus, generally designated as 10. The microwave apparatus includes a substrate 12 (see FIG. 2) of an electrically conductive metal, such as brass, which serves as a support structure for the microwave apparatus. A flat plate 14 of a dielectric material, such as a teflon-glass mixture, having a metal layer 16 coated on the lower surface thereof, is mounted on the substrate 12, the metal layer 16 being electrically and mechanically connected to the substrate 12. The metal layer 16, which serves as a ground plane, may be any metal having good electrical conductivity, such as copper.

A diode mounting base 18 (see FIG. 2) having good electrical and heat conducting properties, such as gold plated copper, is mounted in a threaded hole in the substrate 12. The diode mounting base 18 is screwed into the threaded hole causing it to be electrically and mechanically connected to the substrate 12 and electrically connected to the metal layer 16. A diode 20 (see FIG. 2) having an anode electrode 22 and a cathode electrode 24 is mounted on the diode mounting base 18. The diode 20 is constructed in a manner suitable for TRAPATT operation such as described in U.S. Pat. No. 3,600,649. The anode electrode 22 is electrically and mechanically connected, such as by soldering, to the diode mounting base 18. Since the diode mounting base 18 is electrically connected to the metal layer 16 which serves as a ground plane, the anode electrode 22 of the diode 18 is electrically connected to ground. The diode mounting base 18 is screwed into the substrate until the diode cathode electrode 24 makes mechanical and electrical contact with a metal layer 26 which is mounted on and bonded to the upper surface of the dielectric plate 14. Although the microwave apparatus described herein shows the diode anode electrode electrically connected to ground, it is understood that this configuration is for the purpose of example only. A configuration wherein the electrical connections to the diode electrodes are reversed, that is, the diode is inverted and the diode cathode electrode becomes grounded, is also within the scope and contemplation of the present invention.

A threshold signal application means includes an electrical bias input connector 28 having an outer conducting shell 30 and an inner conducting pin 32. The outer conducting shell 30 is mechanically and electrically connected to the substrate 12 by mounting bolts (not shown). Also included in the threshold signal applications means is a bypass capacitor 34 having an upper capacitor plate 36 and a lower capacitor plate 38 (see FIG. 2). The lower capacitor plate 38 is mounted on and electrically connected, such as by soldering, to the inner conducting pin 32 of the electrical bias input connector 28. The upper capacitor plate 36 is electrically connected, such as by soldering, to the outer conducting shell 30 of the electrical bias input connector 28. Since the outer conducting shell 30 is electrically connected to the substrate 12 and the substrate 12 is electrically connected to the metal layer 16 which serves as a ground plane, the upper capacitor plate 36 of the bypass capacitor 34 is electrically connected to ground. A first microwave choke 40 and a second microwave choke 42 also form a part of the threshold signal application means. The first and second microwave chokes 40 and 42 are mounted on and mechanically bonded to the dielectric plate 14. The first microwave choke 40 is electrically connected between the inner conducting pin 32 of the electrical bias input connector 28 and the second microwave choke 42. The second microwave choke is electrically connected between the first microwave choke and the metal layer 26. Since the metal layer 26 is electrically connected to the diode cathode electrode 24, the inner conducting pin 32 of the electrical bias input connector 28 is electrically connected to the diode cathode electrode through the first 40 and second 42 microwave chokes.

A first variable shunt capacitor 44 forming a part of a first lumped element electrical network is mounted in the substrate 12. The first variable shunt capacitor 44 includes two concentric cylinders which function as the capacitor plates. A moveable plate 46 (see FIG. 2) comprises a solid threaded cylinder having good electrical conducting properties such as brass or copper. A stationary plate 48 comprises a hollow cylinder having good electrical conductivity such as brass or copper. The internal diameter of the stationary plate 48 is sufficiently large to accommodate the moveable plate 46 without allowing physical contact between the two plates. The capacitance of the variable shunt capacitor 44 varies in accordance with the depth of penetration of the moveable plate 46 into the stationary plate 48. A bushing 50 serves as the capacitor dielectric element. The moveable plate 46 is mechanically supported by a threaded bushing 52 which is in turn electrically and mechanically connected to the substrate 12. Since the substrate 12 is electrically connected to the metal layer 16 which serves as a ground plane, the moveable plate 46 of the first variable shunt capacitor 44 is electrically connected to ground through the threaded bushing 52. The stationary plate 48 of the first variable shunt capacitor 44 is electrically connected to the diode cathode electrode 24 through a first metal strip transmission line segment 54 and the metal layer 26.

A second lumped element electrical network includes a second variable shunt capacitor 56 (see FIG. 1). The construction and mounting of the second variable shunt capacitor 56 is substantially the same as the first variable shunt capacitor 44. The moveable plate (not shown) of the second variable shunt capacitor 56 is electrically connected to the substrate 12 through a threaded bushing (not shown). Since the substrate 12 is electrically connected to the metal layer 16 which serves as the ground plane, the moveable plate of the second variable shunt capacitor 56 is electrically connected to ground. The stationary plate 58 (see FIG. 1) of the second variable shunt capacitor 56 is electrically connected to the diode cathode electrode 24 through a second metal strip transmission line segment 60 (see FIG. 1) and the metal layer 26.

A lumped element output filter network includes a variable series capacitor 62. The variable series capacitor 62 includes first and second capacitor plates, 64 and 66 respectively (see FIG. 2), having good electrical conductivity such as copper. The first and second capacitor plates are capacitively coupled by a flat disc 68 of an electrically conductive material such as copper. Insulating discs 70 and 72 mounted on the upper and lower surfaces respectively of the flat coupling disc 68 (see FIG. 2) serve as the capacitor dielectric element. The capacitance of the variable series capacitor 62 varies in accordance with the capacitive coupling between the first 64 and the second 66 capacitor plates. The capacitive coupling is in turn varied by rotating the flat coupling disc 68. Rotation of the flat coupling disc 68 is accomplished using a tuning rod 74 having good electrical insulating properties. The second capacitor plate 66 is electrically connected to the diode cathode electrode 24 through a second capacitor lead 76 and the metal layer 26. An impedance matching transformer 78 forming a part of the output means is mounted on the dielectric plate 14. The impedance matching transformer 78 comprises a metal strip of varying width which is mounted on and bonded to the dielectric plate 14. The width of the metal strip is a function of the desired impedance. The length is functionally related to the output wavelength $\lambda_o$ of the output frequency $f_o$ as shown in FIG. 1. One side of the impedance matching transformer 78 is electrically connected to the first capacitor plate 64 of the variable series capacitor 62 by a first capacitor lead 80. An input-output connector 82, also forming a part of the output means, is mounted on the substrate 12 by mounting bolts (not shown). The input/output connector 82 includes an outer conducting shell 84 and an inner conducting pin 86. The inner conducting pin 86 is electrically connected, such as by soldering, to the other side of the impedance matching transformer 78.

Figure 3:
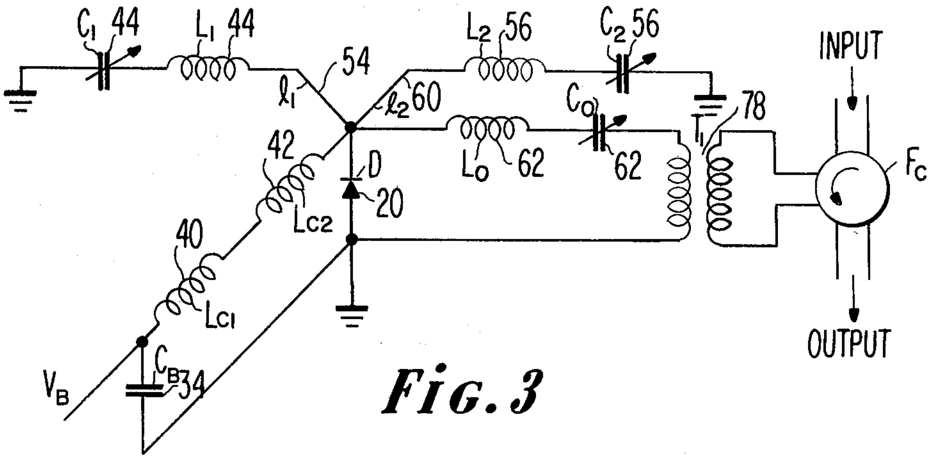
FIG. 3 is a schematic circuit diagram of the broad-band microwave apparatus of the present invention as represented by FIGS. 1 and 2.

Referring to FIG. 3, there is shown a schematic circuit diagram of the broad-band microwave apparatus 10. D represents the diode 20. $L_1$ represents the inductance in series with the first variable shunt capacitor 44, $C_1$ represents the capacitance of the first variable shunt capacitor 44 and $l_1$ represents the first metal strip transmission line segment 54. The inductance $L_1$ and the capacitance $C_1$ combine to form the first lumped element electrical network. The first lumped element electrical network and the first metal strip transmission line segment 54 are electrically connected in parallel with the diode 20. This circuit can be tuned over a wide range of impedance conditions including that of resonance at a desired frequency $f_1$ by tuning the first variable shunt capacitor 44. $L_2$ represents the inductance in series with the second variable shunt capacitor 56, $C_2$ represents the capacitance of the second variable shunt capacitor 56 and $l_2$ represents the second metal strip transmission line segment 60. The inductance $L_2$ and the capacitance $C_2$ combine to form a second lumped element electrical network. The second lumped element electrical network and the second metal strip transmission line segment 60 are also electrically connected in parallel with diode 20. The second lumped element electrical network can be tuned over a wide range of impedance conditions including that of resonance at a desired frequency $f_2$ by tuning the second variable shunt capacitor 56. $L_o$ represents the inductance associated with the variable series capacitor 62. $C_o$ represents the capacitance of the variable series capacitor 62. The inductance $L_o$ and the capacitance $C_o$ combine to form a series connected lumped element output filter network. This output filter network can be made to pass the desired output frequency $f_o$ by tuning the variable series capacitor 62. $T_1$ represents the impedance matching transformer 78. The impedance matching transformer transforms the impedance of the diode 20 into an impedance which matches that of an external transmission line (not shown) thereby allowing maximum power transfer to an external load (not shown). $F_c$ represents a ferrite circulator, which is electrically connected to the input/output connector 82.

$V_B$ represents a pulsed or DC reverse bias voltage which is applied at the electrical bias input connector 28. The input connector 28 is electrically connected to the diode cathode electrode 24 through the first microwave choke 40, the second microwave choke 42 and the metal layer 26. Consequently, the pulsed or DC reverse bias voltage applied at the bias input connector 28 appears at the diode cathode electrode 24. $C_B$ represents the capacitance of the bypass capacitor 34. $L_{c1}$ and $L_{c2}$ represents the inductance of the first and second microwave chokes 40 and 42. Together, the bypass capacitor 34, the first microwave choke 40 and the second microwave choke 42 form a biasing circuit which prevents leakage of the microwave energy into an external pulsed or DC reverse bias power supply (not shown).

When frequencies contained in a composite signal are harmonically related, the energy contained in the desired harmonic can be extracted at that harmonic frequency by presenting the signal generator with the appropriate load impedances. Ideally, the appropriate load impedances are either zero, infinite or purely reactive at the unwanted harmonic frequencies and largely resistive at the desired harmonic, thus confining the unwanted harmonic frequency signals to the internal operation of the apparatus, while passing only the desired harmonic to the external load. It is theoretically possible within the scope of this invention to extract energy at any frequency that is harmonically related to the fundamental trapped plasma frequency of the diode operating in the TRAPATT mode. However, for purposes of illustration, the description of the preferred embodiment of the present invention will proceed with the energy being extracted from the second harmonic of the fundamental trapped plasma frequency.

In the preferred embodiment of the present invention, the pulsed or DC reverse bias voltage from the external source (not shown) is applied to the cathode electrode 24 of the diode 20 through the bias input connector 28 and the first and second microwave chokes 40 and 42. The magnitude of the applied pulsed or DC reverse bias voltage is below the threshold required to trigger the diode 20 into generating microwave energy in the TRAPATT mode of operation. A ferrite circulator (shown in FIG. 3) may be used to couple microwave energy from an external source (not shown) to the diode 20. The microwave signal is applied to the diode 20 by way of the input-output connector 82, the impedance matching transformer 78 and the variable series capacitor 62. The applied microwave signal combines with the applied pulsed or DC reverse bias voltage and triggers the diode 20 into the TRAPATT mode of operation. The diode 20 operating in the TRAPATT mode generates a microwave signal at the fundamental trapped plasma frequency. The generated microwave signal is rich in harmonics, the second harmonic in this case being equal to the frequency of the applied microwave signal. Consequently, the frequency of the applied microwave signal is equal to the desired output frequency $f_o$.

The parameters $C_1$ and $L_1$ of the first lumped element electrical network are designed to provide a series resonance condition at $f_1$. This condition is essentially equivalent to a near zero impedance at $f_1$. The parameters $C_2$ and $L_2$ of the second lumped element electrical network are designed to provide an appropriate reactance at $f_2$. The parameters $C_o$ and $L_o$ control the reactive portion of the impedance presented to the diode at the frequency $f_o$.

Since the operative frequencies $f_1, f_2$ and $f_o$ are harmonically related, and the diode 20 has been presented with a largely resistive load impedance only at $f_o$, the energy contained at the harmonic frequency $f_o$ is extracted from the complex frequency generated by the diode. The extracted harmonic frequency $f_o$ is transmitted to the circulator through the impedance matching transformer 78, and the input-output connector 82. The circulator in turn transmits the frequency $f_o$ to an appropriate terminating load impedance (not shown). The magnitude of the microwave energy transmitted to the terminating load impedance is greater than the magnitude of the input microwave energy from the external source.

One of the advantages of the microwave amplifier disclosed herein over previous TRAPATT amplifier designs is an increase in bandwidth resulting from the use of variable lumped electrical circuit parameters. Bandwidth capability of a tuned TRAPATT amplifier is inversely proportional to circuit Q, which in turn is a function of the ratio of energy stored in the circuit to energy dissipated. The stub-tuned or chip-tuned transmission line segments, used for impedance matching in previous TRAPATT amplifier designs, store more energy than lumped circuit elements. Consequently, the bandwidth of amplifiers of the previous designs is narrower than that of the present design.

Another advantage provided by the present invention is the flexibility of tuning afforded by the variable lumped circuit elements. Each lumped-element electrical network is designed such that the network may be tuned over a wide range of impedance conditions including that of resonance at a specific frequency. This permits complete tuning flexibility at that frequency by means of only one adjustment. In addition, tuning at one frequency has relatively little effect on the tuning at the other frequencies. Consequently, when providing loads at the fundamental trapped plasma frequency and the second and third harmonics thereof as described in the present embodiment of the invention, only three simple and largely independent in-circuit adjustments are required to properly tune the amplifier, thus negating the cut and try method of the traditional design. It is also to be noted that because these adjustments are made from the ground plane side of the device as shown in FIG. 2, no problems involving the tuning effects from the proximity of the adjustment tool are encountered.

Although the preferred embodiment of the present invention has been described operating as a microwave amplifier, it may also be operated as a microwave oscillator. There are two principal differences between the oscillator mode of operation and the amplifier mode of operation previously described. First, the ferrite circulator (shown in FIG. 3) is not used in the oscillator case since microwave energy from an external source is not required. Second, the magnitude of the pulsed or D.C. reverse bias voltage applied to the diode 20 in the oscillator case is equal to or greater than the threshold voltage required to trigger the diode into generating microwave energy in the TRAPATT mode of operation. Otherwise, the method of extracting energy at a desired harmonic frequency of the fundamental trapped plasma frequency is the same in both cases.

I claim:

1. A broad band microwave apparatus of the type including a transmission line, a semiconductor element positioned in said line for generating, in response to a threshold signal, a microwave signal having a plurality of harmonically related frequency signal components, means for applying said threshold signal to said semiconductor element, and output means for transmitting a predetermined harmonic frequency signal component, wherein the improvement comprises:

a plurality of variable impedance lumped element electrical networks, receptive of said microwave signal, each of said networks being respectively associated with a given one of said harmonic frequency signal components of said microwave signal and being respectively tunable substantially independently from the others of said networks over a range of impedance conditions including that of resonance at the frequency of the associated harmonic frequency signal component, each of said networks being formed of an inductance and a variable capacitance connected in series; and output means, electrically connected to the one of said networks associated with said predetermined harmonic frequency signal component, for transmitting said predetermined signal component to a terminating load impedance;

each of the remaining of said networks being connected in parallel across said semiconductor element, whereby said apparatus provides to said terminating load impedance substantially only said signal component at said predetermined harmonic frequency and substantially confines the remaining of said plurality of signal components by tuning the apparatus at each of said harmonic frequencies in substantial isolation from the others.

2. A broad-band microwave apparatus in accordance with claim 1 in which the said semiconductor element comprises one or more diodes adapted to operate in the TRAPATT mode, each diode having an anode electrode and a cathode electrode.

3. A broad-band microwave apparatus in accordance with claim 2 wherein said threshold signal comprises a pulsed or DC reverse bias voltage which exceeds a predetermined threshold value, across the electrodes of said diodes to effect said diodes being triggered into said TRAPATT mode of operation.

4. A broad-band microwave apparatus in accordance with claim 2 wherein said threshold signal is the sum of a pulsed or DC reverse bias voltage, having a magnitude less than a predetermined threshold value, and an RF voltage of an applied microwave input signal, said sum having a magnitude exceeding said threshold value whereby said diode is triggered into amplifying said microwave input signal.

5. A broad-band microwave apparatus in accordance with claim 1 in which the output means comprises an output impedance matching transformer.

6. A broad-band microwave apparatus in accordance with claim 5 in which the impedance transformer comprises a metal film strip of varying width which is electrically connected to said one lumped element network.

* * * * *